(12) United States Patent
Atout et al.

(10) Patent No.: US 12,119,738 B2
(45) Date of Patent: Oct. 15, 2024

(54) TEC CONTROLLER CLAMP CIRCUIT

(71) Applicant: Analog Devices International Unlimited Company, Limerick (IE)

(72) Inventors: Kareem Atout, Kanata (CA); Lawrence Howard Edelson, Fremont, CA (US); Noel Castro Tenorio, Batangas (PH)

(73) Assignee: Analog Devices International Unlimited Company, Limerick (IE)

( * ) Notice: Subject to any disclaimer, the term of this patent is extended or adjusted under 35 U.S.C. 154(b) by 491 days.

(21) Appl. No.: 17/461,555

(22) Filed: Aug. 30, 2021

(65) Prior Publication Data

US 2022/0239217 A1 Jul. 28, 2022

Related U.S. Application Data (60) Provisional application No. 63/141,976, filed on Jan. 26, 2021.

(51) Int. Cl.
*H02M 1/00* (2007.01)
*G05B 6/02* (2006.01)
(Continued)

(52) U.S. Cl.
CPC ............ *H02M 1/0045* (2021.05); *G05B 6/02* (2013.01); *G05F 1/46* (2013.01); *H02M 3/155* (2013.01); *F25B 2321/0212* (2013.01)

(58) Field of Classification Search
None
See application file for complete search history.

(56) References Cited

U.S. PATENT DOCUMENTS

| | | | | |
|---|---|---|---|---|
| 6,094,918 A | * | 8/2000 | Burbidge | G05D 23/24 62/3.7 |
| 6,205,790 B1 | * | 3/2001 | Denkin | G05D 23/1912 165/255 |

(Continued)

FOREIGN PATENT DOCUMENTS

CN 114793063 7/2022

OTHER PUBLICATIONS

"ADN8830: Thermoelectric Cooler Controller", Analog Devices Data Sheet, (2012), 22 pgs.

(Continued)

*Primary Examiner* — David Earl Ogg
(74) *Attorney, Agent, or Firm* — Schwegman Lundberg & Woessner, P.A.

(57) ABSTRACT

Circuitry and techniques described herein can use a clamp circuit to provide back-drive compensation in applications where a thermoelectric cooler (TEC) device is to be controlled. A back-drive compensation circuit can be used to inhibit or prevent a linear output stage of a TEC control circuit from being forced out of its intended operating range. The clamp circuit can be implemented using a variety of circuit topologies, such as including a comparator arrangement with hysteresis. In another approach, a linear amplifier topology can provide clamping behavior, such as by injecting or sinking a current at the output node or an intermediate node to inhibit or prevent the output node or intermediate node from being driven outside a specified voltage range by an external source.

20 Claims, 6 Drawing Sheets

(51) Int. Cl.
*G05F 1/46* (2006.01)
*H02M 3/155* (2006.01)

(56) References Cited

U.S. PATENT DOCUMENTS

| | | | |
|---|---|---|---|
| 6,486,643 B2 | 11/2002 | Liu | |
| 6,981,381 B1 | 1/2006 | Wang et al. | |
| 2002/0089316 A1 | 7/2002 | Liu | |
| 2002/0090012 A1* | 7/2002 | Kroeger | G05D 23/1913 372/34 |
| 2003/0033819 A1* | 2/2003 | Prescott | G05D 23/1919 62/3.7 |
| 2009/0195980 A1* | 8/2009 | Shih | F25B 21/02 62/126 |
| 2015/0145588 A1* | 5/2015 | Chao | G05F 3/262 327/513 |
| 2020/0409400 A1 | 12/2020 | Sun et al. | |

OTHER PUBLICATIONS

"HFAN-08.2.0: How to Control and Compensate a Thermoelectric Cooler (TEC)", APP 3318 Tutorials, Maxim Integrated Projects, Inc., [Online] Retrieved from the Internet: <URL: https://www.maximintegrated.com/en/design/technical-documents/tutorials/3/3318.html>, (Sep. 16, 2004), 4 pgs.

"Ultracompact, 1.5 A Thermoelectric Cooler (TEC) Controller—ADN8834", Analog Devices Data Sheet, (2018), 27 pgs.

Murphy, Troy, "AN-705 Application Note: ADN8830-EVAL TEC Controller Instructions", Analog Devices, Inc., (2004), 4 pgs.

"European Application Serial No. 22152761.7, Extended European Search Report mailed Aug. 5, 2022", 8 pgs.

"European Application Serial No. 22152761.7, Communication Pursuant to Article 94(3) EPC mailed Jul. 27, 2023", 5 pgs.

"European Application Serial No. 22152761.7, Response filed Nov. 7, 2023 to Communication Pursuant to Article 94(3) EPC mailed Jul. 27, 2023", 15 pgs.

* cited by examiner

TEC CONTROLLER CLAMP CIRCUIT

CLAIM OF PRIORITY

This patent application claims the benefit of priority of Atout et al., U.S. Provisional Patent Application No. 63/141,976, titled "TEC CONTROLLER LINEAR STAGE CLAMPING CIRCUIT," filed on Jan. 26, 2021, which is hereby incorporated by reference herein in its entirety.

FIELD OF THE DISCLOSURE

This document pertains generally, but not by way of limitation, to regulator circuit configurations and related control techniques, and more specifically, to control of thermoelectric cooler (TEC) devices.

BACKGROUND

Thermoelectric cooler (TEC) devices can be used for a variety of applications, involving heating or cooling, or both. By contrast with vapor-compression refrigeration, TEC devices are compact solid-state devices, and do not require use of liquids or moving parts, such as providing a high degree of ruggedness and reliability. TEC devices use the Peltier effect to drive heat transfer or flux at an interface between two dissimilar materials. In order to provide heating or cooling, respectively, a polarity of an electrical current provided to a TEC device can be used to control whether the TEC device is operating in a heating or cooling mode. For example, if current is regulated in a positive direction to enter a positive terminal of a TEC device, the TEC device can operate in a cooling mode. Similarly, if current is regulated in a negative direction to enter a negative terminal of a TEC device, the TEC device can operate in a heating mode.

A surface of a TEC device can be thermally coupled (e.g., conductively coupled) with another structure to provide heating or cooling using thermal conduction. As an illustration, a device to be heated or cooled can include a semiconductor device or a semiconductor device package. For example, a TEC device can be included as a portion of an active cooling or temperature regulation apparatus for an electro-optical device such as light-emitting diode, light-emitting diode array, or laser device.

SUMMARY OF THE DISCLOSURE

Various control circuit topologies can be used to drive a thermoelectric cooler (TEC) device, to provide heating or cooling operation, or both. In one approach, a control circuit can provide bi-directional current regulation to a TEC device using a combination of a linear regulator circuit and a switched-mode regulator circuit. Such a combination can include an "H-bridge" configuration, where a first half-section of the "H" topology comprises a linear output stage of a linear regulator circuit coupled to a first terminal of a two-terminal TEC device, and the other half-section of the "H" topology comprises a switched-mode output stage of a switched-mode regulator circuit coupled to a second terminal of the two-terminal TEC device.

Use of a hybrid approach including both linear and switched-mode regulator circuits provides comparatively higher efficiency of switched-mode operation at higher output levels along with the capability to still provide a continuous regulated output at lower output levels using the linear mode, particularly when cross-over occurs between heating and cooling regimes and current polarity reverses. Another capability provided by using a hybrid approach is that single power supply voltage can be used to power the control circuit (e.g., a single-ended positive supply and a reference node, versus a bipolar supply having positive and negative-valued voltages). This can simplify implementation of TEC temperature regulation systems, such as where a TEC control circuit includes a monolithic integrated circuit.

The present inventors have recognized, among other things, that use of a hybrid control circuit topology can present various challenges. By way of theory, but not by way of limitation, when a TEC device has an external heat source or thermal mass applied to one of the TEC device surfaces, such as externally thermally forcing the TEC device and creating a corresponding thermal differential across the TEC device, the TEC device itself develops a voltage between the TEC device terminals which can then be impressed upon the control circuit. This internally-generated voltage from the TEC device can be referred to as a Seebeck voltage. Generally, the Seebeck voltage is independent of the TEC control circuit and appears as a voltage offset that is driven back into a TEC control circuit output. When a TEC control circuit includes a linear output stage, this "back drive" of the Seebeck voltage can drive portions of the linear output stage beyond a specified reference voltage, for example driving the voltage at the output node of the linear stage to a potential below the control circuit ground or reference potential.

When the linear stage of the control circuit is back-driven in such a manner by the Seebeck voltage, feedback and regulation behavior of the control circuit can be disrupted. This can result in a discontinuity in control circuit behavior and a resulting temperature control non-linearity or other temperature regulation error. Temperature regulation error or discontinuity can occur particularly when a TEC device is operated at or near a transition between heating and cooling operational modes. Such temperature regulation error may in turn cause other output perturbations from a system being heated or cooled by the TEC device, such as frequency drift or error in an output from an electrooptic device thermally coupled with the TEC device.

In order to address such a challenge, while still using a linear regulator circuit topology (or a hybrid control circuit topology including both linear and switched-mode regulator circuits), the present inventors have developed circuitry and techniques to provide back-drive compensation. A back-drive compensation circuit can be used to inhibit or prevent a linear output stage from being forced out of its intended operating range such as by using a clamp circuit. The clamp circuit can be implemented using a variety of circuit topologies, such as including a comparator arrangement with hysteresis. In another approach, a linear amplifier topology can provide clamping behavior, such as by injecting or sinking a current at the output node or an intermediate node to inhibit or prevent the output node or intermediate node from being driven outside a specified voltage range by an external source such as the Seebeck voltage from a TEC device. Use of back-drive compensation such as shown and described in various examples herein can include use of an integrated clamp circuit, such as co-integrated (e.g., monolithically or otherwise within the same device package) with other TEC control circuit blocks, or an external back-drive compensation circuit can be separate from an integrated control circuit.

In an example, an apparatus or system can include or can use a thermoelectric cooler (TEC) control circuit to control a temperature of a TEC device by driving the TEC device differentially, the TEC control circuit comprising a linear regulator circuit comprising an output to drive a TEC device first input node, a switched-mode regulator circuit comprising an output to drive a TEC device second input node, a current sensing circuit to provide a signal indicative of a current sourced or sunk by the TEC device through the output of the linear regulator circuit, and a back-drive compensation circuit comprising a difference amplifier having an input coupled to the TEC device first input node and an output to drive a clamp circuit to inhibit the TEC device first input node from being driven beyond a specified reference voltage at or near a transition between heating and cooling operational modes of the TEC device.

In an example, an apparatus or system can include or can use temperature control system, the temperature control system comprising a thermoelectric cooler (TEC) device: and a TEC control circuit comprising a linear regulator circuit comprising an output to drive a TEC device first input node, a switched-mode regulator circuit comprising an output to drive a TEC device second input node, a current sensing circuit to provide a signal indicative of a current sourced or sunk by the TEC device through the output of the linear regulator circuit, and a back-drive compensation circuit comprising a differential amplifier having an input coupled to the TEC device first input node and an output to drive a clamp circuit to inhibit the TEC device first input node from being driven beyond a specified reference voltage at or near a transition between heating and cooling operational modes of the TEC device.

In an example, temperature control can be performed using a system or apparatus, such as using a method for regulating a temperature, comprising receiving an indication of a sensed temperature, generating a control signal to a thermoelectric cooler (TEC) control circuit in response to the received indication of the sensed temperature, and establishing a voltage across a TEC device using the control signal, the establishing the voltage across the TEC device using a linear regulator circuit comprising an output to drive a TEC device first input node, and a switched-mode regulator circuit comprising an output to drive a TEC device second input node, where the method comprises providing back-drive compensation by driving a clamp circuit to inhibit the TEC device first input node from being driven beyond a specified reference voltage at or near a transition between heating and cooling operational modes of the TEC device.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Apparatus and techniques are described herein to provide a control circuit including back-drive compensation. Back-drive compensation can be used to suppress or inhibit external driving of a linear regulator circuit output beyond its intended range of operation, such as suppressing or inhibiting the external driving of a linear regulator circuit output below a control circuit ground potential or other control circuit reference potential. For example, a control circuit can be used to drive a thermoelectric cooler (TEC) device to provide temperature regulation. A temperature sensor can provide feedback to the control circuit, such as to maintain a specified temperature set-point or provide a specified temperature range during operation. The TEC device can be thermally coupled to another structure, such as to provide heating or cooling, or both. Use of back-drive compensation as shown and described herein can reduce or suppress temperature regulator error or a discontinuity in temperature regulator output, associated with a Seebeck voltage being driven by a TEC device back into an output of a TEC control circuit. Such regulator error or output discontinuity can otherwise occur at or near a transition between heating and cooling operational modes of the TEC device.

Figure 1:
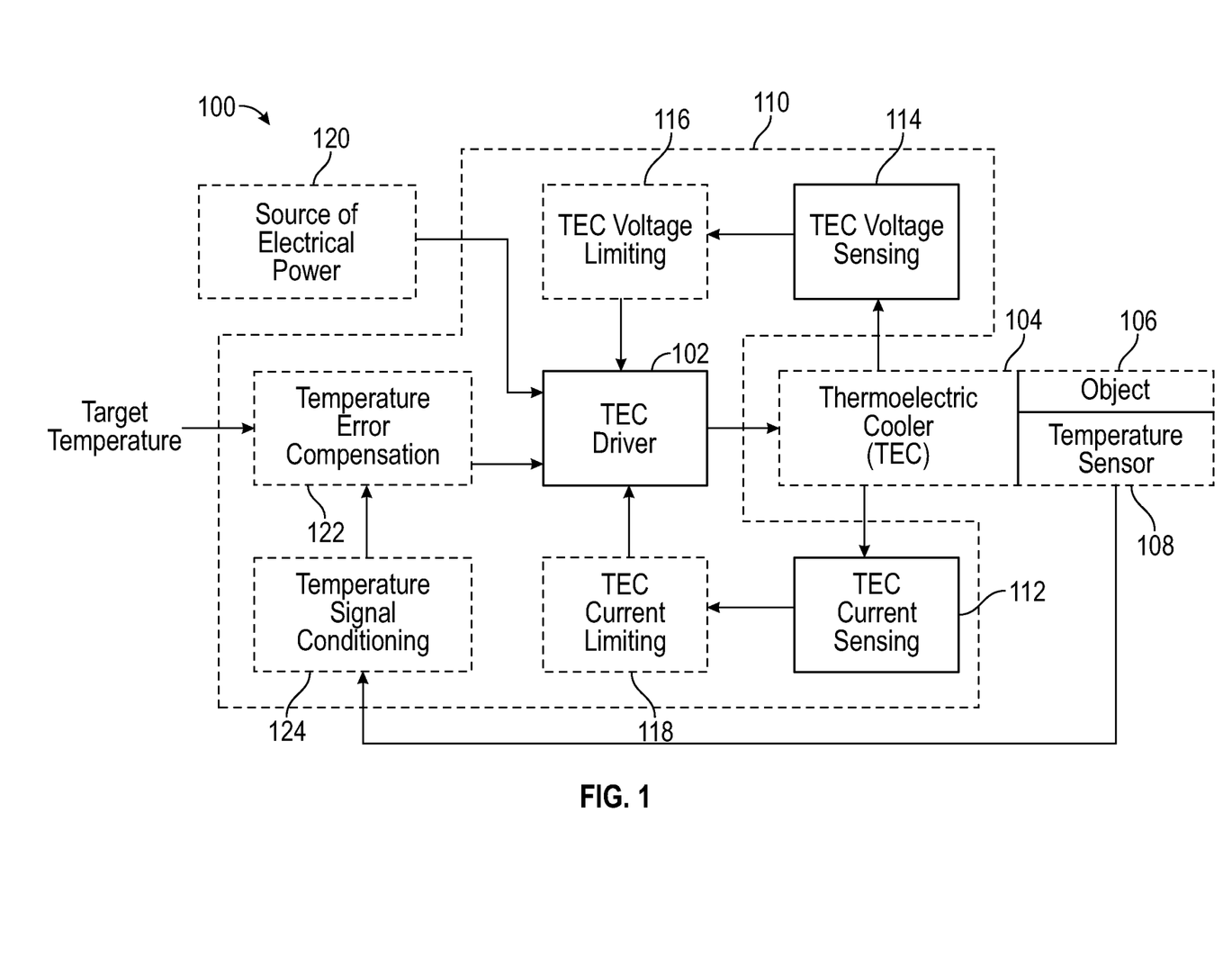
FIG. 1 illustrates generally an example comprising a system, including a thermoelectric cooler (TEC) device and a TEC control circuit.

FIG. 1 illustrates generally an example comprising a system 100, including a thermoelectric cooler (TEC) device 104 and a TEC control circuit 110. The TEC control circuit 110 can be powered by a source of electrical power 120 (e.g., a power supply configured to generate one or more voltages for use by the TEC control circuit 110). As an example, a portion or an entirety of the TEC control circuit 110 can be implemented as an integrated circuit (e.g., a monolithic integrated circuit). Use of a hybrid linear and switched-mode regulation topology, such as shown illustratively in FIG. 2 and FIG. 3, can allow the TEC control circuit 110 to operate using a single-ended power supply, such as reducing a pin count of an associated integrated circuit package housing the TEC control circuit 110 or simplifying the power supply used as a source of electrical power 120.

Generally, the TEC control circuit 110 can include various blocks, such as circuitry for performing current sensing 112, voltage sensing 114, and associated current limiting 118 and voltage limiting 116. The TEC control circuit 110 can include a driver circuit 102, such as providing two or more output nodes that can be electrically coupled to a TEC device 104. In this manner, temperature regulation can be performed, such as to regulate a temperature (e.g., heat or cool, or selectively both heat and cool) an object 106. Feedback can be provided using a temperature sensor 108 (e.g., a solid-state sensor such as diode, transistor, thermocouple, or resistive temperature sensing device).

Feedback from the temperature sensor 108 can include an analog signal indicative of temperature that is then processed and compared to an analog signal indicative of a temperature set point, such as using a feedback control scheme implementing proportional-integral-derivative (PID) compensation. In another example, such control can be performed such as by digitizing a signal from the temperature sensor 108 and performing comparison between a digital representation of the sensed temperature and a representation of a set point. Generally, signal conditioning can be performed within a monolithic integrated circuit-based TEC control circuit 110, such as using signal conditioning circuitry 124 and error compensation circuitry 122. Alternatively, or in addition, one or more of signal conditioning or error sensing can be performed externally to a monolithic integrated circuit-based TEC control circuit 110. Regardless of how and where the temperature error is determined, an output, such as a control signal from an error compensation circuit 122, can be generated for use in controlling the driver circuit 102. In response, the driver circuit 102 can adjust a voltage applied across the TEC device 104 to provide heating or cooling action to drive the temperature of the object 106 toward an established set-point or constrain the temperature of the object 106 within an established range.

Figure 2:
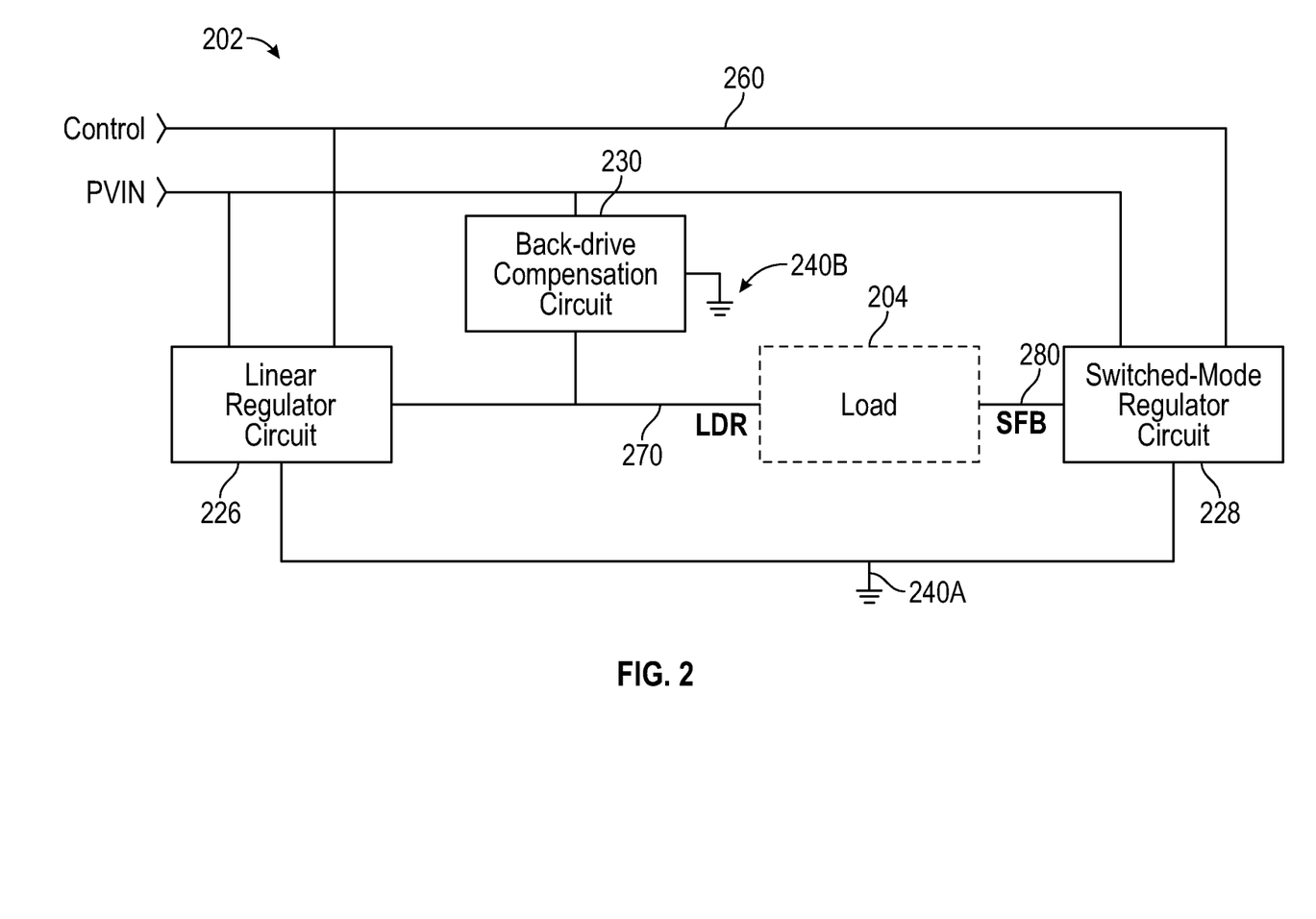
FIG. 2 illustrates generally an example comprising a driver circuit topology, including a switched-mode regulator circuit, a linear regulator circuit, and a back-drive compensation circuit.

FIG. 2 illustrates generally an example comprising a driver circuit 202 topology, including a switched-mode regulator circuit 228, a linear regulator circuit 226, and a back-drive compensation circuit 230. As mentioned above, various regulation circuit topologies can be used to drive a load 204. In the example of FIG. 2, the linear regulator circuit 226 can provide an output stage comprising a half-section of an "H-bridge" topology, and the switched mode regulator circuit 228 can form the other half-section of the "H," with the load 204 connected between the two regulator circuits 226 and 228. In the illustrative example of a TEC control circuit, the load 204 can be a TEC device. An output node 270 of the linear regulator circuit can be referred to as "LDR" (e.g., low dropout regulator output) and can be connected to a first terminal of the load 204, and an output node 280 (e.g., switched-mode output feedback, "SFB") can be connected to a second terminal of the load 204. In the illustrative example of controlling a TEC device, the LDR node can be connected to a positive terminal of the TEC device and the SFB node can be connected to a negative terminal of the TEC device.

The linear regulator circuit 226 and switched mode regulator circuit 228 can both be powered by a single positive-going supply node, PVIN, though the layout and conditioning of the PVIN node may be different for each regulator circuit, such as to establish different power supply domains from a noise or isolation perspective. Similarly, the linear regulator circuit 226 and switched-mode regulator circuit can be connected to a common return or reference node 240A, such as can be referred to as "ground," even though such a reference node need not literally be at ground potential or even zero volts. As in the example of PVIN, the reference node 240A need not be commonly shared between the switched mode regulator circuit 228 and the linear regulator circuit 226, and each of the regulator circuits 226 and 228 may be referenced to a separate representation of the reference node 240A to create separate return paths or "ground domains."

Figure 3:
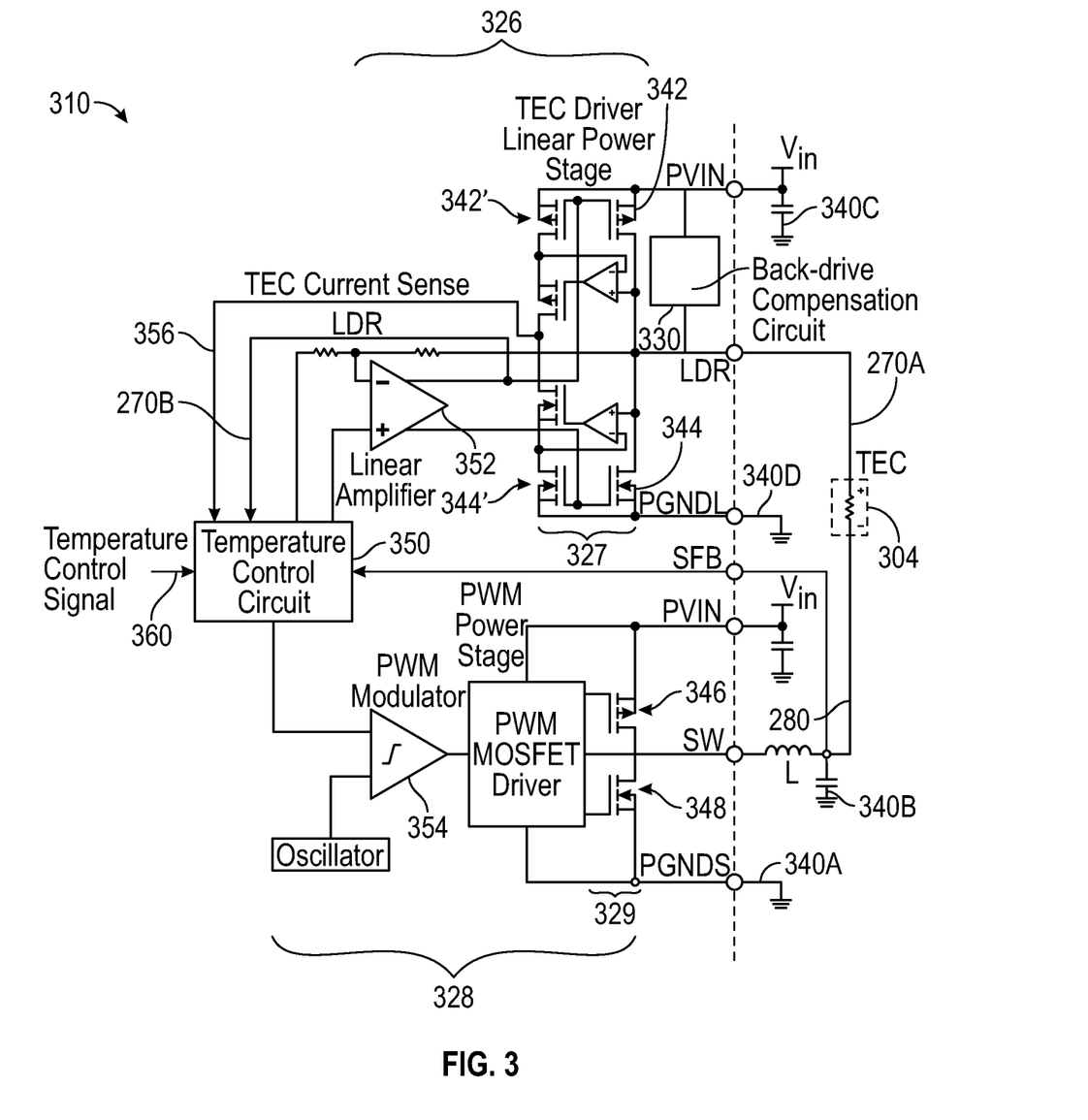
FIG. 3 illustrates generally an illustrative example comprising a TEC control circuit topology, including a switched-mode regulator circuit, a linear regulator circuit, and a back-drive compensation circuit.

As discussed elsewhere herein, the driver circuit 202 can include or can be coupled to a back-drive compensation circuit 230, such as powered by a supply node PVIN or a supply node derived therefrom, and including an output connected to the linear regulator circuit 226 output node 270. The back-drive compensation circuit can also be coupled to a reference 240B, such as at the same potential as the reference node 240A. For example, as shown in FIG. 3, the linear regulator circuit 226 and back-drive compensation circuit 230 can share a common linear regulator circuit "ground domain" designated as node "PGNDL" 340D, used by the linear regulator circuit 226 block. Referring back to FIG. 2, the back-drive compensation circuit 230 can be used to clamp the node 270 voltage such as by suppressing or inhibiting the node 270 from achieving a potential below that of the reference node 240B (or reference node 240A). Such clamping can be achieved by injecting current into the LDR node, either directly using the clamp circuit, or using a signal from the clamp circuit to modulate an output transistor in the output stage of the linear regulator circuit 226. The back-drive compensation circuit 230 can be co-integrated with other portions of the driver circuit 202 or located separately, such as separate from an integrated circuit housing the driver circuit 202.

FIG. 3 illustrates generally an illustrative example comprising a TEC control circuit 310 topology, including a switched-mode regulator circuit 328, a linear regulator circuit 326, and a back-drive compensation circuit 330. Similar to the example of FIG. 2, FIG. 3 shows in more detail an illustrative but non-restrictive example of an H-bridge topology, where the H-bridge comprises output transistors 342 and 344 included as a portion of a linear regulator output stage 327, and transistors 346 and 348 included as a portion of a switched-mode regulator output stage 329.

The switched mode regulator circuit 328 can include an oscillator and comparator circuit 354 to form a pulse-width-modulated (PWM) output to a PWM driver circuit, and the output stage 329 can be used to drive a switched node SW coupled to an inductor, "L," such as an inductor located externally to an integrated circuit housing a portion or entirety of the remainder of the TEC control circuit 310. The configuration shown in FIG. 3 is a buck configuration, but such an example is illustrative, and other switched-mode regulator topologies can be used. In FIG. 3, a TEC device 304 is connected between an output side of the inductor L at node 280, (SFB) and the linear stage 327 output node 270A (LDR). The node 280 (SFB) can be used to provide feedback to the temperature control circuit 350, which can generate a signal to the PWM modulator comparator circuit 354.

As mentioned elsewhere, different power and ground "domains" can be used for signal isolation, such as to keep shot noise associated with the switched mode regulator circuit 328 from inducing noise in the linear regulator circuit 326 output or feedback loop. For example, nodes labeled PVIN can be supplied by a shared external power supply connected to node $V_{IN}$, such as supplying separate pins of an integrated circuit housing the TEC control circuit 310 (and attached to corresponding decoupling or filter capacitors). Similarly, different reference nodes can be separately connected as shown by nodes 340A, 340B, 340C, and 340D.

Generally, the linear regulator circuit 326 includes an output stage 327 driven by a linear amplifier. An error or control signal provided to the linear amplifier 352 can be generated by a temperature control circuit 350, such as using monitored signals indicative of an output voltage of the linear regulator circuit 326 at node 270B, corresponding to a voltage value at node 270A (LDR), and an indication of sensed current 356 being supplied or sunk from the TEC device 304. As mentioned elsewhere herein, the linear regulator circuit 326 can be used in comparatively lower output ranges, such as to facilitate continuous sourcing of current to the TEC device 304 or correspondingly, sinking current from the TEC device 304, to maintain a specified voltage across the TEC device 304 in coordination with control of the switched-mode regulator circuit 328. At comparatively higher output ranges, either the upper PMOS transistor 342 or the lower NMOS transistor 344 can be biased fully-on, and the switched-mode regulator circuit 328 can be used to provide a specified voltage at the node 280 SFB relative to the LDR node 270A.

As mentioned elsewhere herein, the TEC device 304 may impose a voltage across the nodes 270A and 280 (between the LDR and SFB nodes), causing the node 270A of the linear regulator circuit output stage 327 to fall below the reference potential established at node 340D. Such "back-drive" by the TEC device 304 can cause the linear regulator output stage 327 to perform improperly, such as generating an erroneous current sensing signal at node 356 or biasing the LDR node. As discussed further below in relation to FIG. 5A, FIG. 5B, and FIG. 5C, such disruption can result in an unwanted error in temperature control such as a temperature excursion of the TEC device 304. The address such behavior, the present inventors have included a back-drive compensation circuit 330. In the example of FIG. 3, the back-drive compensation circuit 330 is shown as connected between the PVIN node and the LDR node. As discussed above, the back-drive compensation circuit 330 is also generally connected to a reference node (such as at the same potential as node 340D, PGNDL). The back-drive compensation circuit 330 can include a clamp circuit such as to constrain a voltage of the LDR node within a desired range.

For example, if during a transition from a warmer environment to a cooler environment, the TEC device 304 imposes a Seebeck voltage that drives LDR negative with respect to the reference node 340D, PGNDL (e.g., the voltage drop across LDR and SFB results in a node voltage at LDR that is below a potential of PGNDL), the back-drive compensation circuit 330 can inject a current into the LDR node to maintain the LDR at a voltage level at or above the reference node 340D level (e.g., clamping LDR to prevent LDR from going below the ground potential represented by node PGNDL). Such an example is illustrative, and clamping action need not be restricted to driving LDR to maintain a voltage level above PGNDL node 340D potential.

Figure 4A:
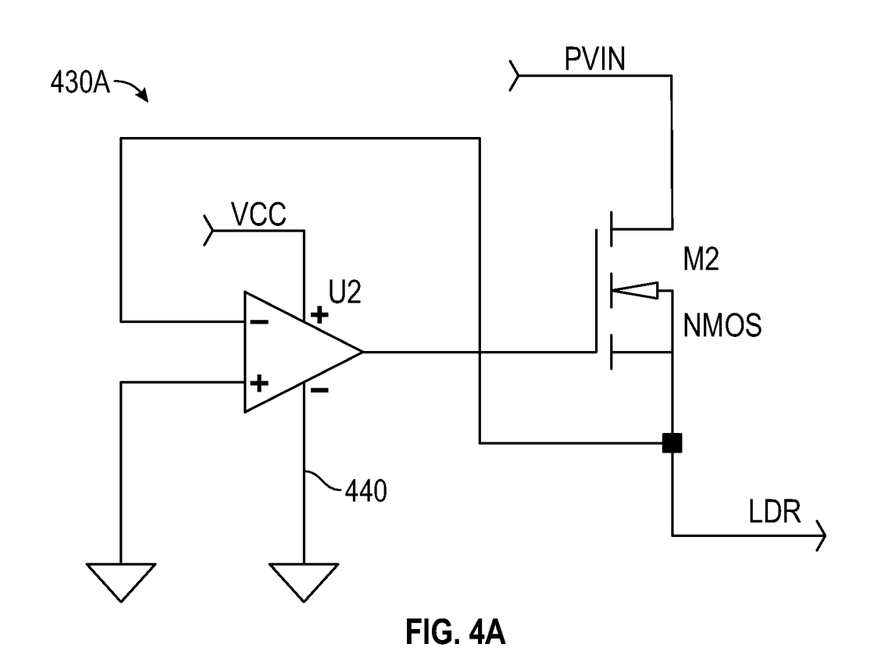
FIG. 4A illustrates generally an illustrative example comprising a linear clamp circuit topology, such as can be used to provide back-drive compensation.
Figure 4B:
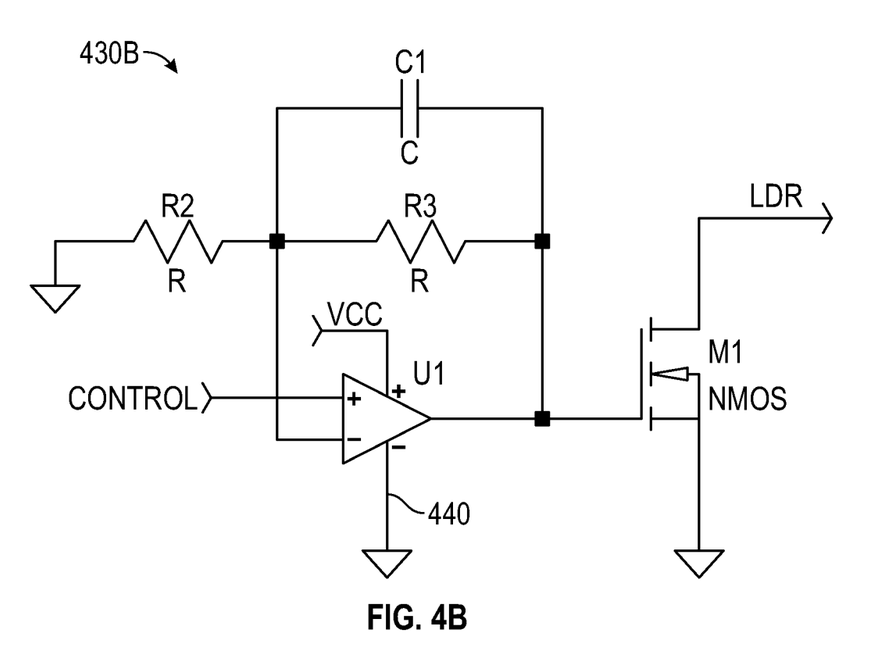
FIG. 4B illustrates generally an illustrative example comprising a comparator-triggered clamp circuit, such as can be used to provide back-drive compensation.

Illustrative examples of clamp circuits that can be used to provide the back-drive compensation are shown in FIG. 4A and FIG. 4B. The examples of FIG. 4A and FIG. 4B show circuits where an NMOS transistor is driven to coerce the LDR node either using a linear difference amplifier arrangement as shown in FIG. 4A, or a comparator-based approach as shown in FIG. 4B. Alternatively, referring back to FIG. 3, a transistor in the output stage 327 can be driven, or a replica device (e.g., a transistor 342' or 344') or bias node can be controlled by the linear clamp amplifier or clamp comparator, to achieve a result similar to driving the LDR node directly through an NMOS from either the PVIN or the ground node. If replica devices (342' or 344') are entirely bypassed by the linear clamp amplifier or clamp comparator, an error in current sense value may occur because the clamp circuit may source or sink current outside the feedback loop driving the replica devices (342' or 344'). By contrast, controlling clamping of the LDR node using the output stage 327 such as driving a bias node therein with the clamp circuit, for example, can allow current sensing to remain operational during clamping, such as allowing the sensed current 356 to accurately depict the TEC device 304 current even when the LDR node is being clamped by the back-drive compensation circuit 330.

FIG. 4A illustrates generally an illustrative example comprising a linear clamp circuit topology 430A, such as can be used to provide back-drive compensation. In the example of FIG. 4A, difference amplifier circuit U2 can be supplied by nodes VCC and a reference node 440 (e.g., a ground node such as PGNDL as shown in FIG. 3). The difference amplifier circuit U2 can compare a voltage value of the LDR node with the voltage of the reference node 440, and can provide an output proportional to the difference, such as to drive a clamp transistor M2 (e.g., an NMOS device), so that current can be injected from the PVIN node to the LDR node to prevent the LDR node from being forced below the potential of the reference (e.g., ground) node 440.

FIG. 4B illustrates generally an illustrative example comprising a comparator-triggered clamp circuit 430B, such as can be used to provide back-drive compensation. In the example of FIG. 4B, the comparator-triggered clamp circuit 430B can use a comparator circuit U1 to compare a threshold established by a node, CONTROL, to a value established by the feedback network comprising C1, R2, and R3. As an illustrative example, CONTROL can be set to a ground reference potential corresponding to the analog ground node (e.g., PGNDL) used as a reference for the linear output LDR. The feedback network provides hysteretic behavior, so that the comparator U1 does not toggle repeatedly between states at or near a trigger threshold. When triggered, the comparator circuit U1 can drive an NMOS device to clamp the LDR node to the reference node 440 potential. Once triggered, the clamp circuit 430B can be reset, such as by interrupting or coercing the output node to a value above the ground reference potential, or using other techniques such as a reset circuit in the comparator circuit U1 or feedback network. Such reset behavior can avoid the comparator-triggered clamp circuit 430B being latched in the triggered (e.g., clamped) state.

In the examples of FIG. 3, FIG. 4A, and FIG. 4B, the transistor devices are shown as field-effect transistor (FET) devices but use of such devices is illustrative and other transistor technologies can be used (such as bipolar devices). Similarly, if transistors having one conductivity type are shown, circuit realizations can be implemented using the opposite conductivity type and corresponding modifications to the polarities of the supply circuits or respective control circuits and signals (e.g., a "dual" of the examples shown in FIG. 4A and FIG. 4B).

Figures 5A, 5B:
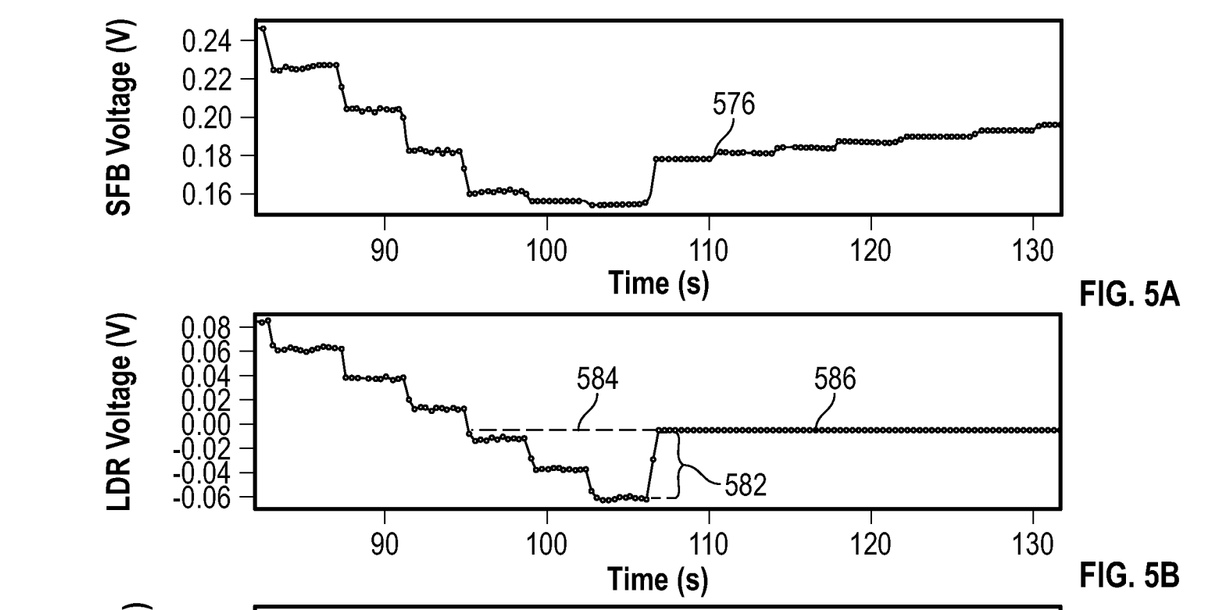
FIG. 5A illustrates generally an illustrative example of a voltage level versus time at a switched-mode regulator circuit output node (SFB) coupled to a terminal of a TEC device.
FIG. 5B illustrates generally an illustrative example of a voltage level versus time at a linear "low-dropout" regulator output node (LDR) coupled to another terminal of the TEC device, and corresponding to the same interval of time and same TEC device as FIG. 5A.
Figure 5C:
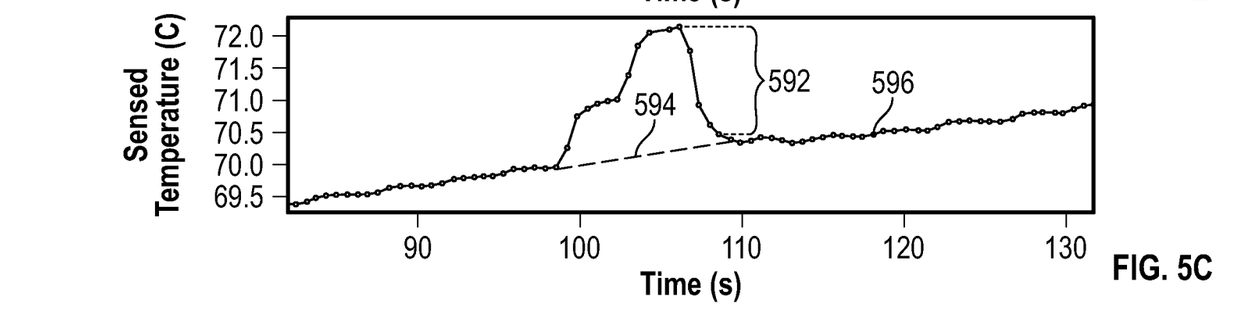
FIG. 5C illustrates generally an illustrative example of a sensed temperature of a structure coupled to the TEC device versus time, corresponding to the same interval of time and same TEC device as in FIG. 5A and FIG. 5B.

FIG. 5A illustrates generally an illustrative example 576 of a voltage level versus time at a switched-mode regulator circuit output node (SFB) coupled to a terminal of a TEC device and FIG. 5B illustrates generally an illustrative example 586 of a voltage level versus time at a linear "low-dropout" regulator output node (LDR) coupled to another terminal of the TEC device, and corresponding to the same interval of time and same TEC device as FIG. 5A. FIG. 5C illustrates generally an illustrative example 596 of a sensed temperature of a structure coupled to the TEC device versus time, corresponding to the same interval of time and same TEC device as in FIG. 5A and FIG. 5B. The voltage waveforms of the examples 576 and 586 resulted in the sensed temperature of FIG. 5C. An excursion 592 is present in the sensed temperature waveform of the example 596 of FIG. 5C. Such an excursion departs from an otherwise nearly-linear temperature progression of the waveform 596. Such an excursion 592 occurs because control of the TEC device is disrupted when the LDR voltage of the example 586 dips below the zero-volt reference potential as shown in the region 582 of the example 586 of FIG. 5B. The region 582 can be associated with a Seebeck voltage being back-driven into the LDR node as discussed elsewhere herein. Use of a back-drive compensation scheme as shown and described above can be used to clamp the LDR voltage in the example 586 to provide a clamping level 584. In this manner, the excursion 592 shown in the example 596 can be inhibited or suppressed, such as to linearize the sensed temperature (e.g., a regulated temperature response) as shown at 594. As an illustration, if the TEC device is thermally coupled to an optoelectronic device such as a laser, the thermal excursion 592 can cause an unwanted wavelength (or frequency) deviation at the output of the laser. By eliminating or reducing the excursion 592 magnitude, a corresponding wavelength (or frequency) deviation can be reduced.

Figure 6:
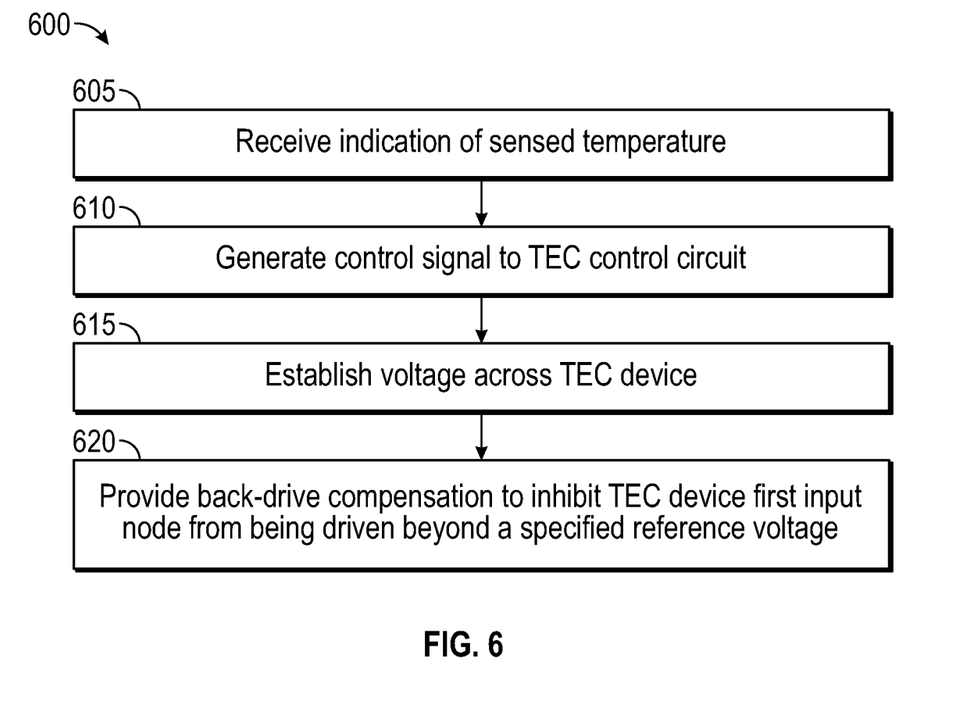
FIG. 6 illustrates generally a technique, such as a method of operation of a TEC control circuit, such as to provide back-drive compensation.

FIG. 6 illustrates generally a technique, such as a method 600 of operation of a TEC control circuit, such as to provide back-drive compensation. The method 600 can include, at 605, receiving an indication of a sensed temperature. The indication can be an analog signal such as obtained using a sensor as mentioned above. The sensed temperature may be supplied from a sensor coupled to a structure being heated or cooled by a TEC device (e.g., the temperature does not need to represent a temperature of the TEC device itself). At 610, in response to either an analog or digital representation of a sensed temperature, a control signal can be generated to a TEC control circuit. Such a control signal can include one or more of an error signal representative of a difference between a sensed temperature and a temperature set-point value, or an indication as to whether heating or cooling operation is being demanded, such as in response to a sensed temperature being outside a specified range or beyond a specified threshold.

At 615, such as in response to the control signal, a voltage can be established across a TEC device. As an illustrative example, the voltage can be dependent on a degree of deviation between a sensed temperature and a temperature set-point, or the voltage can be a specified value established based on a nominal operating voltage of the TEC device to provide fixed heating or cooling thermal flux. At 615, the voltage established across the TEC device can include transitioning the TEC device from a cooling to a heating mode or vice versa. At 620, back-drive compensation can be provided, such as using a back-drive compensation circuit to provide clamping as shown and described elsewhere herein, such as to inhibit at least a TEC device first input node (e.g., a positive node connected to a linear regulator output) from being driven beyond a specified reference voltage.

Various Notes

Each of the non-limiting aspects above can stand on its own or can be combined in various permutations or combinations with one or more of the other aspects or other subject matter described in this document. The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A thermoelectric cooler (TEC) control circuit to control a temperature of a TEC device by driving the TEC device differentially, the TEC control circuit comprising:
   a linear regulator circuit comprising an output to drive a TEC device first input node;
   a switched-mode regulator circuit comprising an output to drive a TEC device second input node;
   a current sensing circuit to provide a signal indicative of a current sourced or sunk by the TEC device through the output of the linear regulator circuit; and
   a back-drive compensation circuit comprising a difference amplifier having an input coupled to the TEC device first input node and an output to drive a clamp circuit to inhibit the TEC device first input node from being driven beyond a specified reference voltage corresponding to a transition between heating and cooling operational modes of the TEC device.

2. The TEC control circuit of claim 1, wherein the difference amplifier is arranged to drive the clamp circuit to establish a shunt current from the TEC device first input node, the shunt current proportional to a supply current provided by the linear regulator circuit, to inhibit the TEC first input node from being driven beyond a specified reference voltage.

3. The TEC control circuit of claim 1, wherein the specified reference voltage corresponds to a common node potential, and wherein the difference amplifier output is arranged to drive the clamp circuit to inhibit the TEC device first input node from being driven below the common node potential.

4. The TEC control circuit of claim 1, wherein the linear regulator circuit comprises an output stage comprising transistors having complementary conductivity types, the output stage comprising a first output stage transistor connected to a positive supply node and a second output stage transistor connected to a node corresponding to the specified reference voltage; and
   wherein the difference amplifier is arranged to drive the clamp circuit to inhibit the first output stage transistor from driving the TEC device first input node below a potential of the node corresponding to the specified reference voltage.

5. The TEC control circuit of claim 1, wherein the difference amplifier comprises a comparator circuit; and
   wherein the comparator circuit is arranged to drive the clamp circuit to inhibit the TEC first input node from being driven beyond the specified reference voltage in response to the comparator circuit being triggered.

6. The TEC control circuit of claim 1, wherein the back-drive compensation circuit is arranged to drive the clamp circuit to inhibit the TEC device first input node from being driven beyond the specified reference voltage corresponding to the transition between heating and cooling operational modes of the TEC device without requiring inhibiting or disabling the current sensing circuit.

7. The TEC control circuit of claim 1, further comprising the clamp circuit.

8. The TEC control circuit of claim 7, wherein the back-drive compensation circuit and the current sensing circuit are monolithically co-integrated with the linear regulator circuit.

9. The TEC control circuit of claim 8, wherein the clamp circuit is also monolithically co-integrated with the back-drive compensation circuit and the current sensing circuit.

10. The TEC control circuit of claim 1, comprising a temperature control circuit, the temperature control circuit configured to control the linear regulator circuit and switched-mode regulator circuit to establish a specified voltage across the TEC device using the TEC device first input node and the TEC device second input node.

11. The TEC control circuit of claim 10, comprising a temperature sensor electrically coupled to the temperature control circuit; and
   wherein the temperature control circuit is configured to adjust the specified voltage in response to a signal indicative of a temperature provided by the temperature sensor, and a temperature set-point value.

12. The TEC control circuit of claim 11, wherein the temperature sensor indicates a temperature of an optoelectronic device.

13. The TEC control circuit of claim 12, wherein the optoelectronic device comprises a laser.

14. The TEC control circuit of claim 11, wherein the temperature control circuit comprises at least one of a digital feedback topology or an analog proportional-integral-derivative (PID) feedback topology.

15. A temperature control system, comprising:
   a thermoelectric cooler (TEC) device; and
   a TEC control circuit comprising:
   a linear regulator circuit comprising an output to drive a TEC device first input node;
   a switched-mode regulator circuit comprising an output to drive a TEC device second input node;
   a current sensing circuit to provide a signal indicative of a current sourced or sunk by the TEC device through the output of the linear regulator circuit; and
   a back-drive compensation circuit comprising a differential amplifier having an input coupled to the TEC device first input node and an output to drive a clamp circuit to inhibit the TEC device first input node from being driven beyond a specified reference voltage corresponding to a transition between heating and cooling operational modes of the TEC device.

16. The system of claim 15, wherein the TEC control circuit comprises a temperature control circuit, the temperature control circuit configured to control the linear regulator circuit and switched-mode regulator circuit to establish a specified voltage across the TEC device using the TEC device first input node and the TEC device second input node.

17. The system of claim 16, comprising a temperature sensor electrically coupled to the temperature control circuit; and
   wherein the temperature control circuit is configured to adjust the specified voltage in response to a signal indicative of a temperature provided by the temperature sensor, and a temperature set-point value.

18. The system of claim 15, further comprising an optoelectronic device mechanically coupled to the TEC device, the TEC control circuit configured to regulate a temperature of the optoelectronic device at least in part by driving heat transfer to or from the optoelectronic device using the TEC device.

19. A method for regulating a temperature, comprising:
receiving an indication of a sensed temperature;
generating a control signal to a thermoelectric cooler (TEC) control circuit in response to the received indication of the sensed temperature; and
establishing a voltage across a TEC device using the control signal, the establishing the voltage across the TEC device using a linear regulator circuit comprising an output to drive a TEC device first input node, and a switched-mode regulator circuit comprising an output to drive a TEC device second input node;
wherein the method comprises providing back-drive compensation by driving a clamp circuit to inhibit the TEC device first input node from being driven beyond a specified reference voltage corresponding to a transition between heating and cooling operational modes of the TEC device.

20. The method of claim 19, comprising regulating a temperature of an optoelectronic device at least in part by driving heat transfer to or from the optoelectronic device using the TEC device.

* * * * *